United States Patent [19]

Cohen

[11] 4,283,775
[45] Aug. 11, 1981

[54] CONTIGUOUS DISK BUBBLE STORAGE

[75] Inventor: Mitchell S. Cohen, Ossining, N.Y.

[73] Assignee: International Business Machines Corporation, Armonk, N.Y.

[21] Appl. No.: 58,718

[22] Filed: Jul. 18, 1979

[51] Int. Cl.³ ............................................. G11C 19/08
[52] U.S. Cl. ...................................... 365/32; 365/36; 365/37; 365/41
[58] Field of Search ....................... 365/32, 36, 37, 41

[56] References Cited

U.S. PATENT DOCUMENTS

| 3,925,768 | 12/1975 | Lin ........................................ 365/36 |
| 3,988,722 | 10/1976 | Keefe et al. ............................ 365/41 |

OTHER PUBLICATIONS

IBM Technical Disclosure Bulletin–vol. 18, No. 9, Feb. 1976, pp. 3082–3084.

*Primary Examiner*—James W. Moffitt
*Attorney, Agent, or Firm*—Jackson E. Stanland

[57] ABSTRACT

A bubble storage system using contiguous propagation elements is described using magnetically soft drive layers for movement of the bubble domains in a bubble domain film, in response to the reorientation of a magnetic drive field in the plane of the drive layers. In contrast with prior art contiguous element propagation structures, charged walls are not employed for movement of bubble domains. Instead, magnetic poles along the drive layers are used to move the domains. Two drive layers are used, each of which is comprised of a magnetically soft material, such as permalloy. The drive layers are located at different heights with respect to the layer in which the magnetic bubble domains exist, the bottom drive layer being comprised of contiguous propagation elements defining a generally undulating edge along which the magnetic bubble domains move. This layer can be comprised of permalloy contiguous disks, diamonds, etc. The top layer is comprised of magnetically soft elements located over the cusp regions formed along the undulating edges of the underlying drive layer. For propagation around the disks or diamonds, the bottom drive layer is predominant in determining bubble motion. However, in the art of the cusp regions along the undulating edge defined by the bottom drive layer, the magnetic poles produced by the top drive layer are predominant. These elements in the top drive layer produce potential wells at those locations corresponding to cusps along the undulating edge defined by the contiguous propagation elements in the bottom drive layer, and therefore control bubble motion in the cusp regions. This eliminates a serious problem to satisfactory bubble motion along contiguous propagation element devices. A single level masking fabrication process is described where the top and bottom drive layers can be fabricated through the same mask, and a total chip design is shown which provides all functions required in a complete storage chip.

15 Claims, 23 Drawing Figures

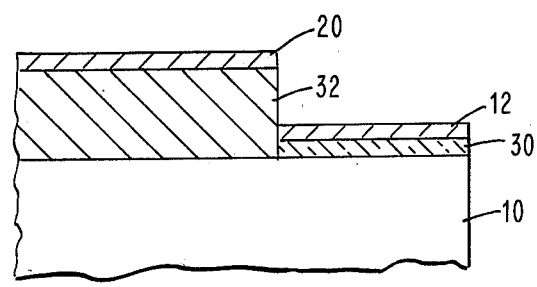
FIG. 9B
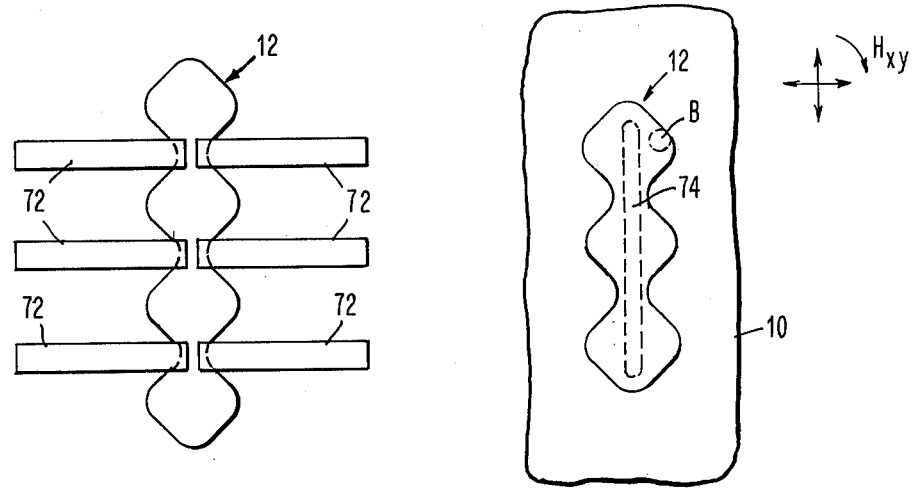
FIG. 11
FIG. 12

CONTIGUOUS DISK BUBBLE STORAGE

DESCRIPTION

1. Technical Field

This invention relates to magnetic bubble domain devices, and more particularly to bubble devices using contiguous propagation elements, wherein the contiguous propagation elements are provided by layers of magnetically soft material, such as permalloy.

2. Background Art

In magnetic bubble domain technology, a magnetic medium, such as a garnet or an amorphous layer, is used to support magnetic bubble domains which can be stabilized and moved in the magnetic medium. Generally, an overlay is used to provide the forces for moving the bubble domains. One such type of overlay is a conductor pattern while another type of overlay is that used in so called "field access" devices. In this latter type of device, a magnetic element is provided along which attractive magnetic forces are produced as a magnetic field reorients in the plane of the propagation elements. This type of field access device is typically comprised of magnetically soft overlays or ion implanted regions of a magnetic material.

Although propagation elements which are separate from one another are widely used for commercially available magnetic bubble devices, contiguous propagation element patterns have been proposed in order to provide high bit density for a given lithographic capability. One such type of contiguous propagation element structures utilizes contiguous "disks" in which generally disk shaped patterns are contiguous to one another and define an undulating edge (such as a serrated edge) along which bubble domains move as a magnetic field reorients in the plane of this propagation pattern. In the case of contiguous propagation elements produced by ion implantation, magnetic charged walls are created which are attractive to the bubble domains and which move along the undulating edge of the ion implanted regions. This pulls the magnetic bubble domains along to provide magnetic bubble domain motion.

At the present time, charged wall devices offer the only way of utilizing the highly attractive geometry provided by contiguous disk type devices. While proposals have been made for using magnetically soft layers to provide contiguous propagation elements, such proposals have not met with success due to a number of problems. For instance, U.S. Pat. No. 3,988,722 shows a structure in which permalloy disks are used for bubble domain propagation, together with an overlying permalloy layer which is apertured to provide a pattern therein. This structure will not work to move magnetic bubble domains along the periphery of the permalloy disks, and additionally requires an amorphous magnetic bubble domain layer, rather than any other type of bubble domain layer. In this structure, the bubble domain motion in the area of the cusp regions along the disk pattern is unsatisfactory, with the result that only very low frequency propagation can be obtained. Furthermore, even at very low frequencies, the reliability of bubble propagation along that structure was very poor. Still further, it is not possible to make the structure of that patent using only a single critical masking step.

A device scheme which can use the contiguous disk (CD) type of geometry but which employs magnetically soft material instead of charged walls would be of considerable interest. Such a structure would offer the identical high bit-packing density of conventional charged wall contiguous devices, but would employ the more familiar processing techniques associated with magnetically soft materials, such as NiFe. Also, the design of components for different functions than propagation, such as bubble generation, stretching, and sensing, could even be easier because the magnetically soft material is already present on the chip for the basic propagation function.

Bubble motion in these new devices is very smooth compared with either conventional charged wall CD devices or with conventional discrete element devices. It may also be pointed out that the permeability loss of discrete element devices upon scale-down to smaller bubbles is expected to be much worse than that of those new devices because narrow bars are avoided.

Attempts have been made to devise NiFe contiguous disk type devices, as illustrated in an article by Y. S. Lin et al in the IEEE Transaction On-Magnetics, Vol. mag-13, page 1744 (1977). In the structure described in that article, propagation patterns having a NiFe layer inside the contiguous disk (FIG. 1A) and patterns having a NiFe layer outside the disk (contiguous holes, FIG. 1B) were described. In both types of patterns, bubbles were stable in the convex portions of the disks for the phase shown, but when the drive field rotated to the opposite phase, failure was observed in the cusp region due to creation therein of repelling poles. This failure mechanism led to circulation around individual disks in the contiguous disk case, and to repulsion away from the cusp in the contiguous-hole case.

In the present invention, the problems associated with prior art contiguous disk structures have been eliminated, and in particular magnetically soft layers are used to provide contiguous disk type structures. In order to solve the problem of unreliable propagation of bubbles along the pattern, means is provided for producing a potential well in the cusp areas so that propagation through the cusp areas is reliable and smooth. As will be noted more fully in the detailed description, two drive layers will be used, where one layer is spaced at a different distance from the magnetic bubble layer than the other drive layer. This disparity in spacing causes a break in the magnetic flux path, so that one drive layer predominates the control of the bubble when the bubble is in the region of the cusp, while the other drive layer predominates when the bubble is moving around the disk. Thus, the bubble will always be in a potential well no matter what its position along the propagation pattern. As will be seen, this provides reliable bubble motion and offers the possibility of reliable propagation at very high frequencies of the drive field. Further, the structure can be made using a single critical masking step and can be provided by materials which are well known as overlay materials in bubble devices. All functions, such as transfer, propagation, generation, sensing, and annihilation can be provided using the same materials for all components required to perform these functions.

Accordingly, it is a primary object of this invention to provide an improved contiguous element bubble structure in which charged magnetic walls are not required for bubble domain motion.

It is another object of this invention to provide advantageous contiguous element bubble devices using magnetically soft materials for the drive layers.

It is another object of the present invention to provide a technique for producing contiguous element propagation devices in which only a single critical masking step is used to provide a plurality of drive layers.

It is another object of the present invention to provide a magnetic bubble domain chip having all functions required for a complete system and in which contiguous propagation elements defined from layers of magnetically soft material are provided.

It is another object of the present invention to provide a magnetic bubble domain structure using contiguous propagation elements comprised of permalloy which provides reliable propagation along the propagation pattern.

It is yet another object of the present invention to provide a magnetic bubble domain chip using contiguous propagation elements and current carrying conductors for the control of bubble domain functions in individual components thereof, where very high current can be carried by the conductors without adverse electromigration effects.

It is another object of the present invention to provide a technique for producing a magnetic bubble domain chip which provides all functions needed for a complete storage system in a process in which a single masking step is used to provide a plurality of magnetic drive layers.

It is another object of the present invention to provide a contiguous disk type of magnetic bubble domain device using drive layers comprising magnetically soft material in which bubbles can be used having diameters close to the minimum line width attainable.

It is another object of the present invention to provide bubble devices using contiguous propagation elements wherein problems associated with crystalline anisotropies in the magnetic drive layer are avoided by using magnetically soft materials which do not exhibit these crystalline anisotropy effects.

DISCLOSURE OF THE INVENTION

This invention pertains to a bubble domain propagation device and total magnetic bubble domain chip, and to a method for making these, wherein magnetic charged walls are not used for movement of magnetic bubble domains. The contiguous propagation elements are provided by a layer of magnetically soft material which defines a propagation pattern having a generally undulating (serrated) edge along which the bubble domains move. This edge includes cusp-like regions wherein bubble domain motion is largely controlled by additional means for producing potential wells to ensure that the bubbles move through the cusp regions smoothly and reliably. In one embodiment, the means for producing potential wells includes another layer of magnetically soft material located at a greater distance from the bubble domains than the first magnetic drive layer.

Thus, in the practice of this invention, a "low" magnetically soft drive layer (thin spacer to bubble domain layer) is used in combination with a "high" magnetically soft drive layer (thick spacer to bubble domain layer) to control bubble domain motion along the entire pattern. The disparity in spacer thicknesses with respect to the bubble domain layer causes a break in the path of magnetic flux from the drive pattern, so that magnetic poles of opposite sign are created at the edges of the "high" and "low" patterns. The geometry is designed so that when a bubble is in the disk region, strong attractive positive poles are associated with the edge of the low, magnetically soft drive layer which override the influence of the corresponding farther distant repulsive negative poles of the high drive layer, thus causing the low drive layer to retain control of the bubble motion. On the other hand, when the bubble is in a cusp region, the poles of the high drive layer become positive and of greater influence than the corresponding negative poles of the low drive layer, which are weak due to the geometry of the low drive pattern in the region of the cusp, so that the high drive layer then takes control of bubble motion. In other words, control of the bubble alternately shifts between the low and the high drive layers when the bubble is respectively in the disk and cusp regions. This means that the bubble will always be in a potential well, no matter what its position along the propagation pattern. In turn, this provides very reliable propagation.

While pluralities of drive layers have been used to provide bubble domain motion in prior art devices, and while different drive layers have been used to provide control in different portions of the propagation pattern, the prior art does now show or suggest the use of two drive layers on the same side of the magnetic bubble domain material for satisfactory motion of bubble domains along a propagation pattern comprised of contiguous propagation elements. Further, the prior art has not shown or suggested a technique for making a total magnetic chip using a single critical masking step for providing the multiple drive layers, and for providing all necessary functions on the chip when such a structure is used.

These and other objects, features, and advantages of the present invention will be more apparent in the following more particular description of the preferred embodiment.

BRIEF DESCRIPTION OF THE DRAWINGS

FIG. 5A is a graph of potential well depth as a function of spacer thickness, while

FIG. 9A is a diagram of a magnetic bubble domain chip using double drive layers in accordance with the present invention, illustrating the provision of all functions required to produce a complete magnetic storage chip, while FIG. 9B is a side view of a portion of the structure of FIG. 9A, showing the use of two different types of spacer materials.

FIG. 11 is an illustration of an alternate double layer drive structure, where the top layer is comprised of bars of magnetically soft material located approximately over the cusp regions of the underlying contiguous diamond pattern.

FIG. 12 is an illustration of a double layer propagation pattern in which the underlying magnetic bubble layer is treated along a rectangular strip thereof (as by ion implantation) in order to create regions which prevent bubble domains from moving around the individual contiguous propagation elements, during rotation of the magnetic drive field $H_{xy}$. This rectangular strip serves to prevent a possible failure mechanism wherein bubble domains may merely recirculate around the individual contiguous propagation elements as the drive field reorients, rather than moving along the periphery of the pattern from one contiguous element to the next.

BEST MODE FOR CARRYING OUT THE INVENTION

Two Layer Propagation Pattern (FIGS. 1A, 1B, 1C, 2A, 2B)

Figure 1A:
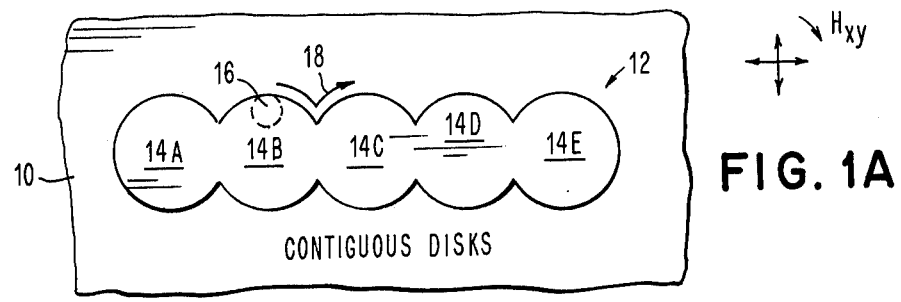
FIG. 1A shows a drive layer comprising a magnetically soft material where the contiguous propagation elements are disk shaped, and the position of a bubble domain for a certain orientation of the magnetic drive field $H_{xy}$.
Figure 1B:
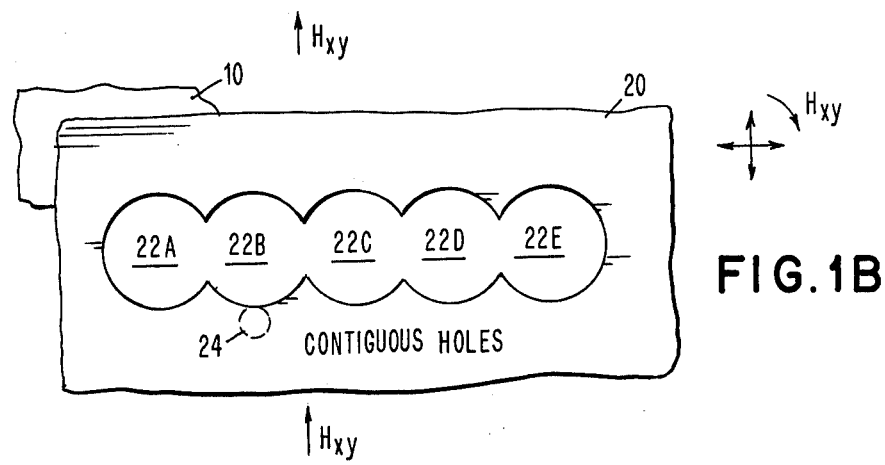
FIG. 1B shows another type of drive layer for movement of bubble domains, which is in this case comprised of a layer of magnetically soft material having apertures therein, the apertures defining contiguous holes in the drive layer. Again, the position of a bubble domain with respect to the drive layer is shown for the same orientation of the drive field $H_{xy}$.
Figure 1C:
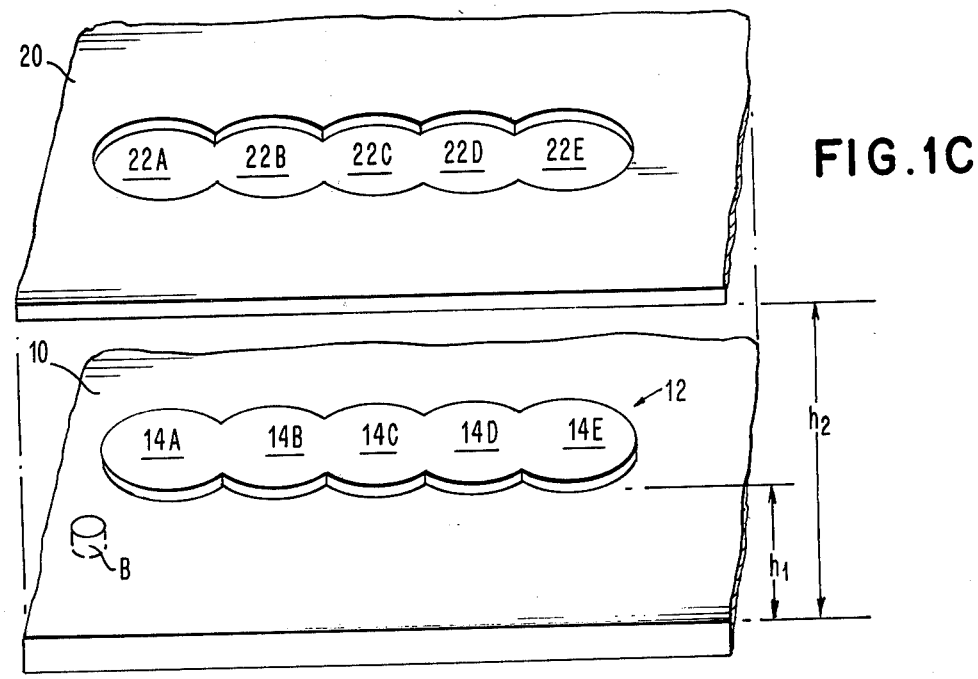
FIG. 1C is an exploded view of a propagation structure in accordance with the present invention, wherein two drive layers comprised of magnetically soft material are located on the same side of a bubble domain layer. The bottom drive layer provides potential wells for the movement of bubble domains along a first portion of the propagation path, while the top drive layer provides potential wells for the movement of bubble domains along a second portion of the propagation path.

These figures illustrate the embodiment for a bubble propagation structure using two separate drive layers, each of which is comprised of a magnetically soft material. Contiguous propagation elements are provided along which the bubble domains move, control of the bubble domain alternating between the bottom drive layer and the top drive layer during different portions of its propagation along a generally undulating (serrated) propagation path. FIGS. 1A–1C illustrate a suitable geometry for the drive layers, while FIG. 2B illustrates the motion of a bubble domain in response to a reorienting drive field, for the structure shown in FIG. 1C.

In more detail, FIG. 1A shows one possible embodiment of the bottom drive layer. A substrate 10, which includes a layer in which bubble domains can be propagated has thereover a layer 12 of a magnetically soft material, such as permalloy. Layer 12 is patterned to provide a plurality of contiguous disks 14A, 14B, 14C, 14D, and 14E. A bubble domain 16 is located in the substrate 10, and will stay under the magnetically soft layer 12. The bubble domain will move along the periphery of propagation drive layer 12 in the general direction of arrow 18 as the magnetic drive field $H_{xy}$ reorients in the plane of layer 12. The position of bubble 16 is its position when $H_{xy}$ has the orientation shown.

FIG. 1B illustrates a suitable embodiment for the top drive layer. For ease of explanation, the substrate is given the same reference numeral 10 as in FIG. 1A. However, the top drive layer 20 is comprised of a layer of magnetically soft material which has apertures 22A, 22B, 22C, and 22E therein. Layer 20 can be comprised of the same magnetically soft material (such as permalloy) as the magnetically soft material comprising bottom drive layer 12, or a different magnetically soft material can be used.

FIG. 1B shows the position of a bubble domain 24 in substrate 10 for the same orientation of drive field $H_{xy}$. As will be noted, the bubble domain stays under the magnetically soft material comprising the drive layer and therefore is located outside the generally circular shaped apertures.

Bubble propagation patterns comprising single drive layers of the type illustrated in FIGS. 1A (contiguous disks) and 1B (contiguous holes) have been previously used to move magnetic bubble domains. However, in both cases, bubble domains were not moved with good reliable propagation margins. In the case of bubble domain movement using the contiguous disk pattern of FIG. 1A, bubbles were stable in the convex portion of the disk for the phase of drive field $H_{xy}$ shown, but were not stable when the drive field rotated to the opposite phase. In this case, failure was observed in the cusp regions due to creation therein of repelling poles. This failure mechanism led to circulation around individual disks in the contiguous disk patterns rather than reliable propagation from one contiguous disk to the next. In the case of the contiguous hole pattern shown in FIG. 1B, repulsion away from the cusp regions occurred and bubble domains would move to another, adjacent propagation pattern thereby causing loss of data.

FIG. 1C shows a two drive layer structure suitable for reliably moving bubble domains in a substrate 10. In order to more clearly relate the structure of FIG. 1C to the drive layers illustrated, the same reference numerals will be used where possible. Thus, the propagation structure is comprised of a bottom drive layer 12 and a top drive layer 20, both of which are spaced from the substrate 10.

In the exploded view of FIG. 1C, a bubble domain B is located in the substrate 10. Bottom drive layer 12 is located at a distance $h_1$ above substrate 10, while top drive layer 20 is spaced at a distance $h_2$ above substrate 10. In the fabrication of this structure, as will be seen later, a larger spacer is used to keep top drive layer 20 at a greater distance from the substrate 10 so that its effects on the bubble domains B will be less than that of the bottom drive layer 12, except for bubble domain motion in certain portions of the propagation path. The disparity in spacer thicknesses between the top and bottom drive layers and the substrate 10 causes a break in the flux path, so that magnetic poles of opposite sign are created at the edges of the top and bottom drive layers. This break in the flux path is used to ensure reliable motion of the bubble along the entire propagation path as will be explained more fully with respect to FIGS. 2A and 2B.

Drive layers 12 and 20 can be produced using the same masking step. In this situation, the contiguous holes 22A–22E will be located directly over the contiguous disks 14A–14E in the bottom drive layer. Thus, if one were to take a top view of the structure of FIG. 1C, it would appear that there would be a continuous layer of magnetically soft material, assuming that the thicknesses of the top and bottom drive layers are the same. Of course, these thicknesses can be varied if desired for any purpose. Also, the apertures need not have the same diameter as the disks.

Figure 2A:
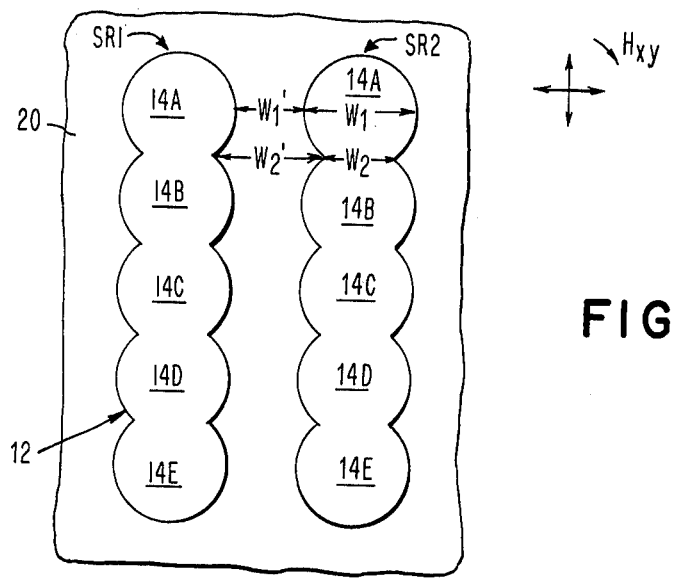
FIG. 2A is a top view of the double layer propagation structure of FIG. 1C, which is used to illustrate the pole strengths associated with the top and bottom drive layers.
Figure 2B:
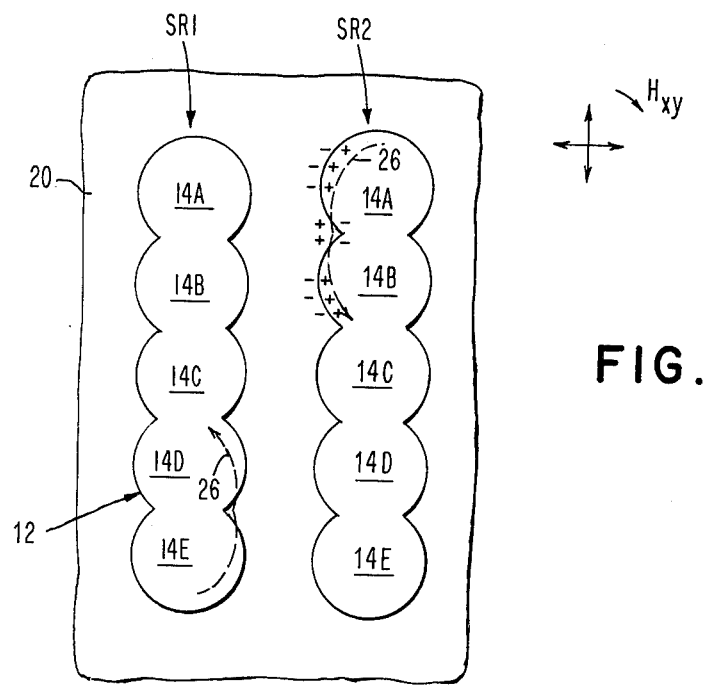
FIG. 2B is also a top view of the propagation structure of FIG. 1C, illustrating the path followed by a bubble domain in an underlying bubble material. The bubble propagation paths are indicated by the dashed arrows.

FIG. 2A illustrates a top view of the structure of the type of FIG. 1C. However, two adjacent propagation registers SR1 and SR2 are shown. These registers have identical top and bottom propagation elements, i.e., the bottom disks 14A–14E and the apertures in top layer 20. The dimensions W1 and W2 are widths along the bottom disk pattern while dimensions W1' and W2' are widths along the apertured top layer 20. Again, the same reference numerals are used for ease of explanation.

The structure comprises the top drive layer 20 having apertures therein so that the contiguous disks 14A–14E can be seen in this top view. In the area of the convex portions of the contiguous disks 14A–14E, the spacer below the contiguous disks 14A–14E is substantially less than that corresponding to the area surrounding these disks. Also, W1 is generally $\geq$ W1', although this is much less critical. This means that the disks 14A–14E are closer to the bubbles than drive layer 20 and, as the bubble domains travel around the convex portions of the contiguous disks, the greatest magnetic influence will be provided by the contiguous disks 14A–14E.

On the other hand, the width W2 of the contiguous disk pattern in the region of the cusps (C) is less than the width W2' of the top drive layer 20. This means that the top drive layer 20 can have a considerable influence on bubble motion when the bubbles are located in the cusp regions.

FIG. 2B illustrates the path of the bubble domains, indicated by the dashed arrows 26, as field $H_{xy}$ reorients in the plane of the drive layers 12 and 20. In more detail, the geometry of the propagation structure is designed so that when a bubble domain is in the contiguous disk region 14A, strong attractive positive poles associated with the edge of the contiguous disk 14A, and indicated by the plus (+) signs, override the influence of the corresponding far-distant repulsive negative (−) poles of the top drive layer 20. This causes the bottom drive layer to retain control of the bubble domain motion when it is along the convex portions of the contiguous disk pattern.

On the other hand, when the bubble domain is in a cusp region, the magnetic poles of the top drive layer 20 becomes positive, (as indicated by the plus signs), and of greater influence than the corresponding negative poles, (as indicated by the minus signs in the cusp region between disk 14A and 14B), of the bottom drive layer 12, which are weak due to the short neck (width W2) at the cusp region. This means that the top drive layer 20 takes control of bubble motion; therefore, the bubble domain travels under the top layer 20 rather than under the bottom drive layer 12 in the cusp regions. In other words, control of the bubble domain alternately shifts between the low and the high drive layers when the bubble is in the disk and cusp regions, respectively. In this manner, the bubble is always in a potential well, no matter what its position along the propagation path defined by the two layer structure. In contrast with prior art techniques using single and double drive layers, the present structure overcomes the aforementioned problems in providing reliable bubble domain motion for the reason that a potential well is created for bubble domain motion along the entire portion of its propagation path.

As will be more fully appreciated later, a two drive layer propagation structure can be provided through a single mask if the top layer is the inverse of the bottom layer. However, the bottom layer can be comprised of contiguous propagation elements while the top layer can be comprised of a different pattern, as long as it provides a potential well in the cusp regions where the bottom layer does not provide reliable bubble motion. A possible embodiment for providing the potential well in the area of the cusp regions will be described in more detail with respect to FIG. 11.

Since the disk pattern controls bubble motion for a greater amount of the propagation path, it is advantageous to have the disk pattern closer to the bubble domains than the apertured layer. However, designs can be made having the apertured pattern closer to the bubbles.

FABRICATION (FIGS. 3A–3C)

Figure 3A:
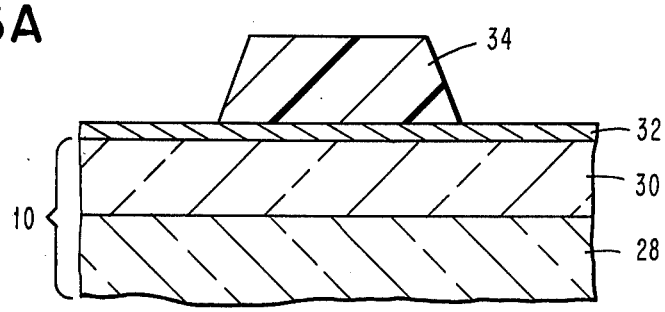
FIGS. 3A–3C illustrate a single masking level technique for forming the double layer propagation structure of FIG. 1C, taken along a line 3—3 of the structure shown in FIG. 2A.

These figures illustrate one possible method for single masking fabrication of the top and bottom drive layers. Here, a cross-sectional view of the fabrication process is provided where the finished structure of 3C is a cross-sectional view taken along the line 3—3 of FIG. 2A. In order to relate the process of FIGS. 3A–3C to the propagation pattern of FIG. 2A, the same reference numerals will be used for the substrate 10, bottom drive layer 12, and top drive layer 20.

In more detail, the substrate 10 is comprised of a bubble domain layer 28 and an overlying dielectric layer 30. The bubble domain layer 28 can be a magnetic garnet layer of a type well known in the art, or any other type of bubble domain material. Its thickness will depend upon the diameter of the bubble domains. For a 10 $\mu$m period pattern dielectric layer 30 is typically comprised of an electrically insulating material such as $SiO_2$ of thickness approximately 400 nm. Located on substrate 10 is a thin plating base layer 32 typically comprised of Ti/Au where the Ti layer (for enhanced adhesion) is about 10 nm thick and the Au layer is approximately 30 nm thick. A photoresist layer is then spun onto plating base layer 32, exposed through a mask, and developed to leave resist layer 34 inside the disk area. That is, layer 34 is located where one of the contiguous disks, such as 14D in FIG. 2A, is to be formed.

Figure 3B:
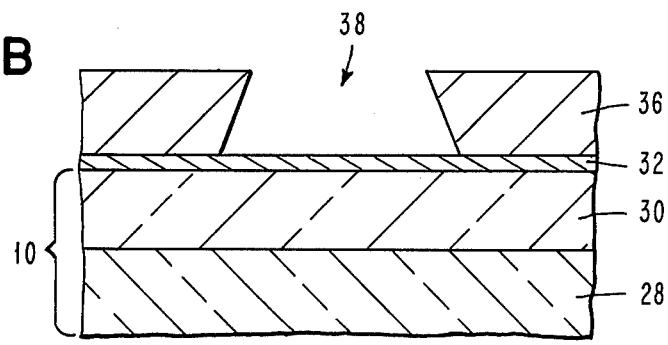
Figure 3C:
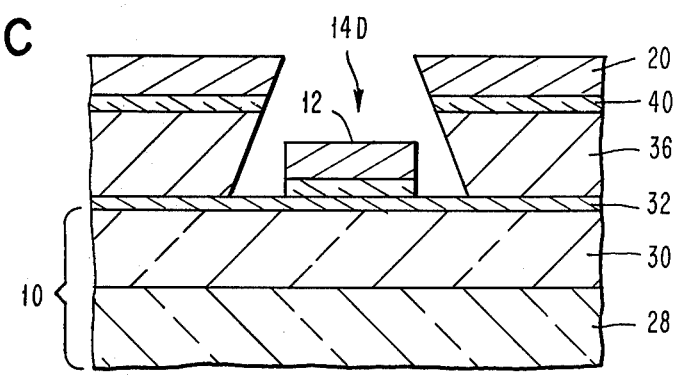

In FIG. 3B, a layer 36 of Au is electroplated on plating base layer 32 to a thickness of about 800 nm, and then resist 34 is removed. This leaves an opening 38 where the contiguous disk 14D will be formed.

In the final step of the process, a layer 40 of TiO₂ is deposited to a thickness of about 30 nm. Layer 40 is used as an adhesion enhancing layer for subsequent deposition of the drive layers 12 and 20. Drive layers 12 and 20 are provided by about 350 nm of NiFe, which is vacuum deposited onto the entire wafer of FIG. 3B to provide the structure of FIG. 3C.

An important step in this process is the profiling of the resist walls 34 (FIG. 3A) so that the resulting gold profile in layer 36 is overhanging, as indicated in FIG. 3B. This overhanging profile ensures separation of the bottom and top drive layers so that the desired pole strengths are developed at the edges. As is known in the art, several techniques are available for providing tapered walls for resist layer 34.

As will be more fully apparent later, the gold layer 36, which is used to elevate top drive layer 20, can be used for current carrying functions in a complete magnetic chip. Since it is not magnetic, it does not adversely influence the propagation pole patterns.

DESIGN CONSIDERATIONS (FIGS. 4, 5, 6, 7, AND 8)

Figure 4:
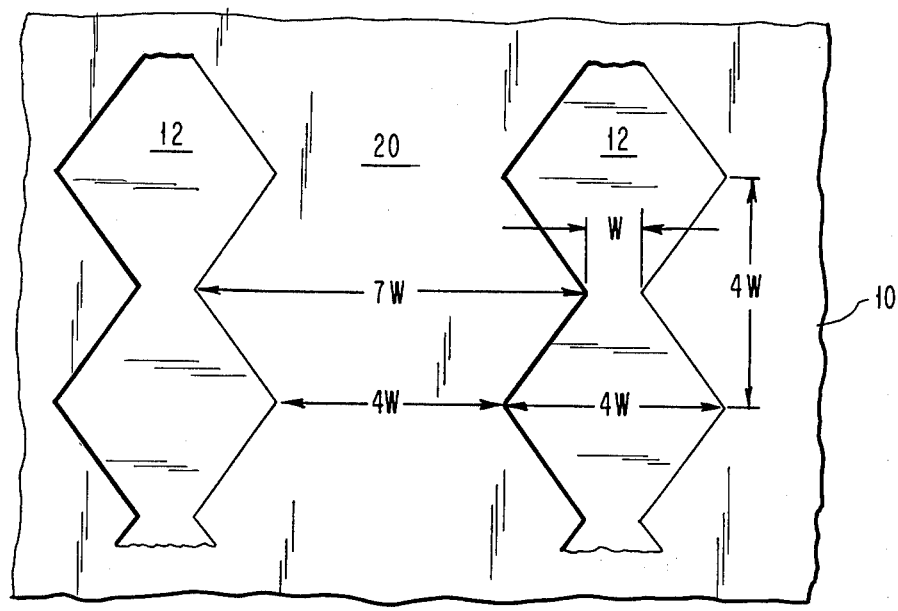
FIG. 4 is a schematic illustration of a double layer propagation pattern which is used to explain the design of a suitable pattern for movement of bubble domains.

A model of the bubble domain behavior under the influence of the top and bottom drive layers can be obtained by a determination of the balance of the opposing magnetic fields on a bubble domain from the poles at the edges of the adjacent top and bottom drive layers. For modeling and design purposes, a geometry such as that shown in FIG. 4 was used. The bottom layer 12 was comprised of contiguous diamond structures $4W \times 8W$, where W is the width of the neck of the cusp along the contiguous diamond regions of bottom drive layer 12. In the crude analytical model used, the bottom permalloy diamond structures were represented by a square of side 2.82W, while the corresponding adjacent top permalloy region (high diamond region) was represented by a square of side 4W. The bottom permalloy cusp was represented by a bar of length W and width 4W, while a corresponding adjacent top permalloy region (high cusp region) was represented by a square of side 7W. In the calculations, the bubble center was arbitrarily assumed to be positioned beneath the permalloy shape under consideration at a distance of $W/2$ from the edge.

Figure 5A:
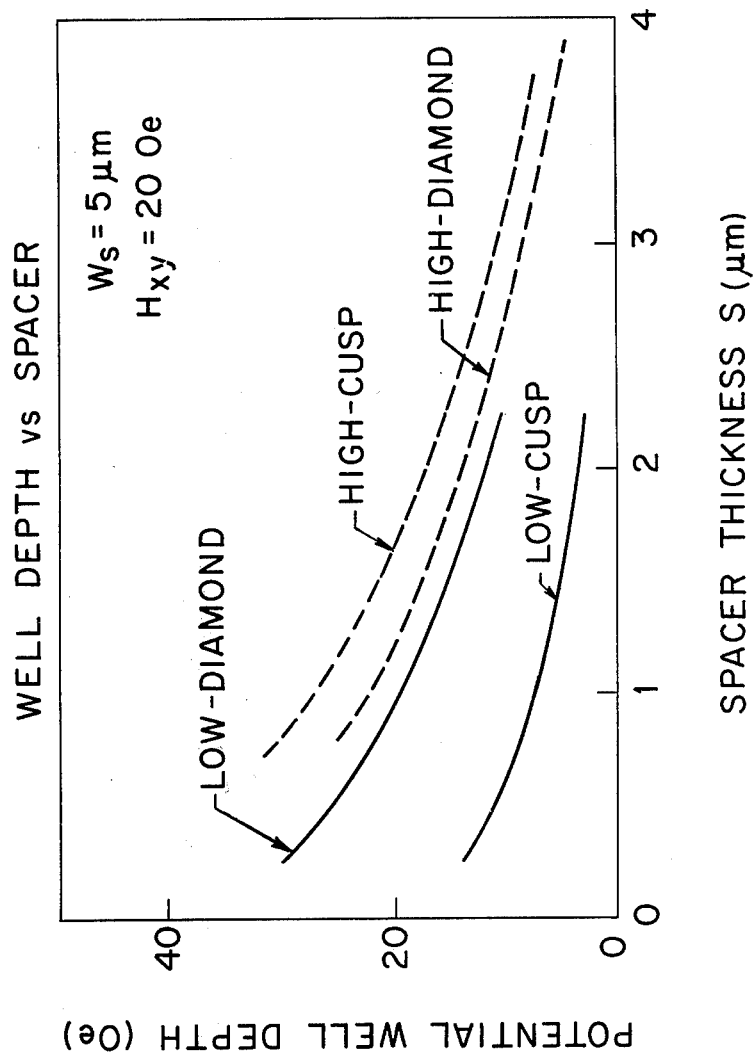

Under these assumptions, the potential well depth as a function of spacer thickness was found for a given drive-field magnitude for a bubble in a well at the edge of each of the four separate permalloy shapes: low and high diamond, and low and high cusp regions. This is shown in FIG. 5A. The magnetic drive field direction was assumed to be that giving the maximum well depth. It was further assumed that the magnitude of such a potential well approximated the height of the potential hill experienced by a bubble near the edge of a permalloy shape of interest, when a sense of the drive field was reversed. Using these results, and imposing the arbitrary requirement that the superposition of potentials from both the high and low permalloy regions must yield a net potential well of at least 10 Oe depth, the curves of FIG. 5B could be drawn for 5 micron bubbles for a 20 Oe drive field.

Figure 5B:
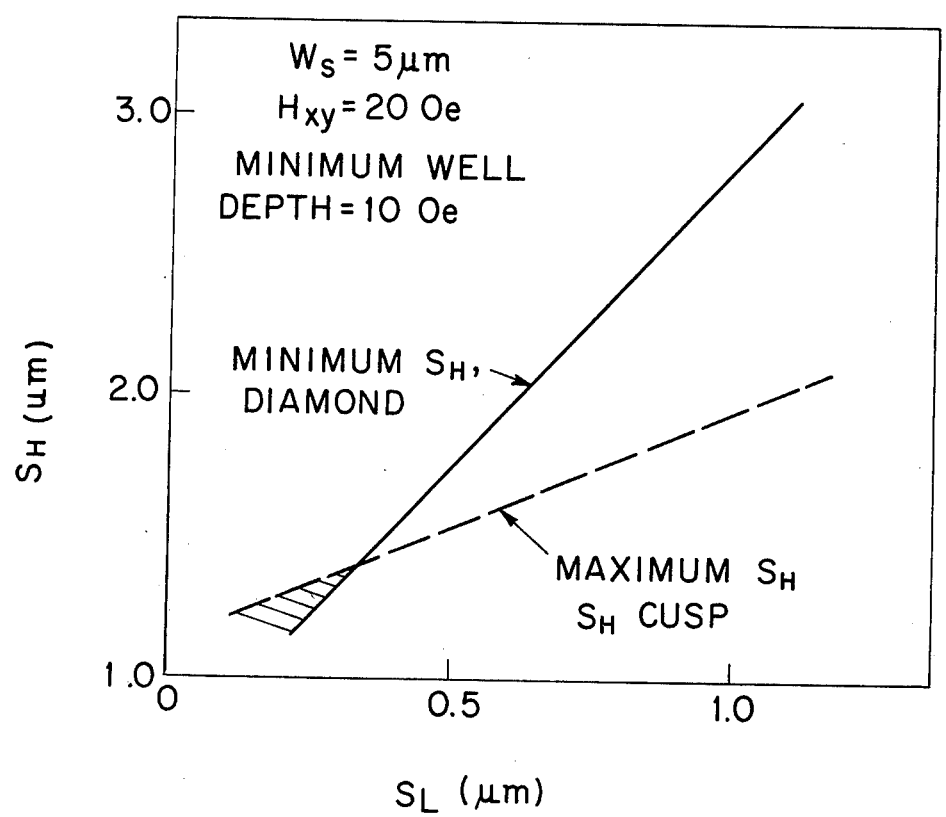
FIG. 5B is a theoretical graph illustrating the effect of the spacings of the drive layers from the bubble domain material, using the schematic structure shown in FIG. 4.

In FIG. 5B, the solid curve is the minimum value of the high-diamond spacer $S_H$ as a function of the low-diamond spacer $S_L$ for the required 10 Oe well depth, while the broken curve gives the maximum value of the high-cusp spacer $S_H$ as a function of the low-cusp spacer $S_L$ for the same 10 Oe well depth. Since the values of $S_L$ for the low diamond and low cusp are identical, as are the values of $S_H$ for the high diamond and high cusp, it is seen that the realizable region, where maximum $S_H$ exceeds minimum $S_H$, is only that region shaded in FIG. 5B. Thus, only values $S_L$ less than 0.34 μm are acceptable, with corresponding values of $S_H$ which must be less 1.37 μm.

Curves similar to those of FIG. 5B were drawn for higher values of drive field $H_{xy}$. It was found that, as the drive field increased, the crossover point of diamond and cusp curves moved to larger values of $S_L$, which reduces the danger of unwanted bubble nucleation. Based on these considerations, practical drive fields of about 30 Oe should be possible for 5 μm bubble devices. Calculations with smaller bubbles show only modest increases in required drive fields.

The values obtained from these calculations are not regarded as precise because of some of the crude approximations that were made. However, the trends demonstrated are in accord with subsequent experiments.

Figure 6:
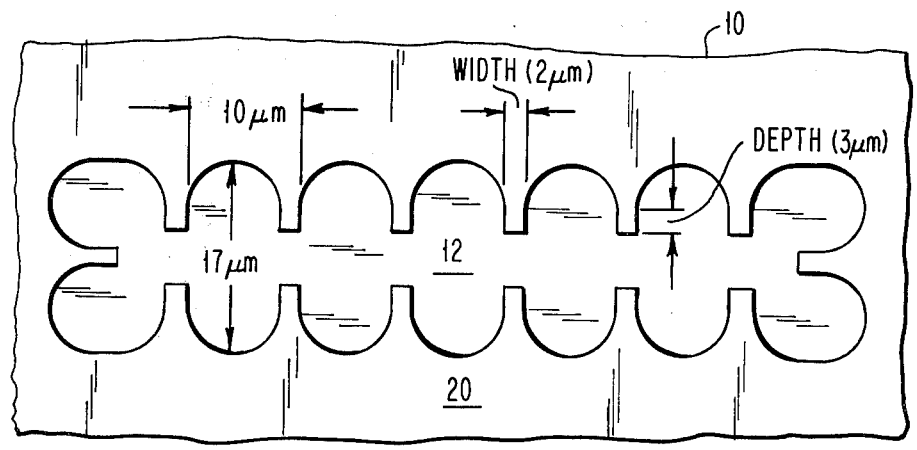
FIG. 6 is a schematic illustration of a possible double layer drive structure used to indicate the effect of the geometry of the cusp regions along the propagation pattern.

Successful preliminary test results were achieved with 5 μm bubbles, and structures for movement of 2 μm bubbles (10 μm period) were fabricated according to these design principles. Patterns having 10 μm period were employed with various values of cusp depth and width as defined in FIG. 6, which is a schematic view of a propagation pattern using bottom drive layer 12 and top drive layer 20.

Quasistatic observation of these 10 μm period devices showed that the bubble traversed the disk region successfully, and within a specified margin was indeed held in the cusp. However, it was noted that while in the cusp region the bubble moved back from the edge, presumably because of the influence of the negative poles emanating from the cusp area of the bottom drive layer. A minimum drive field of about 30 Oe was found, with 18 Oe margins at a drive field of 40 Oe. The failure mechanisms were collapse of the bubble in the cusp at high biases and circulation around individual disks at low biases.

It was found that if the cusps were too narrow, say 1.5 μm or less, high values of minimum drive field resulted, presumably because of the resulting low-reluctance path between disks, leaving too low strengths. On the other hand, if the cusps were too deep, circulation around individual disks at low biases were pronounced because of strip-out failure.

Figure 7:
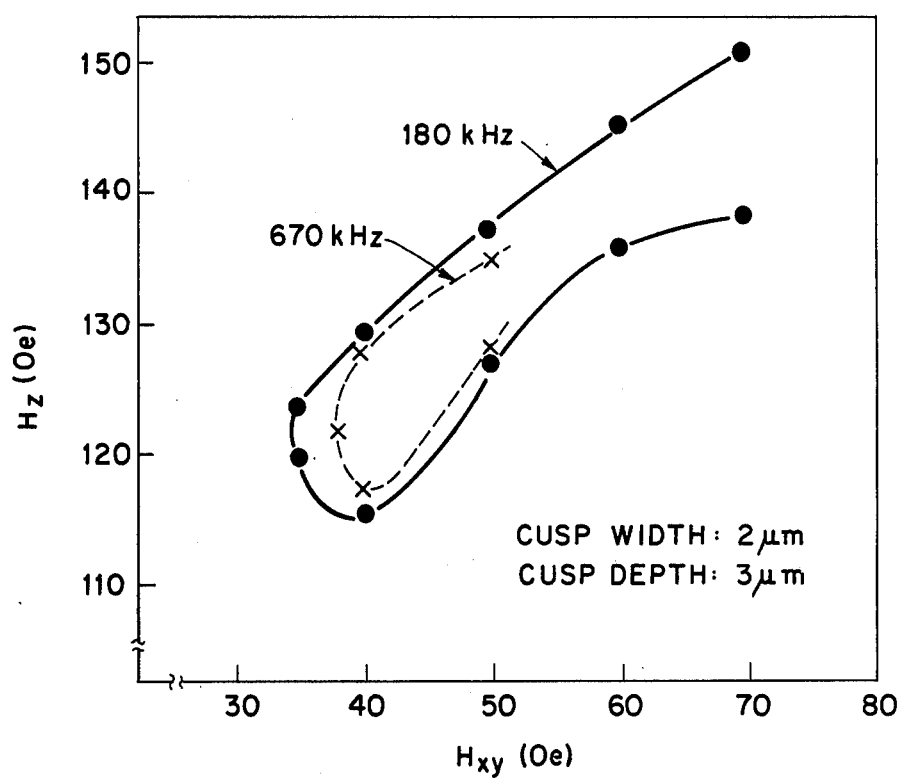
FIG. 7 is a graph of the operating margin for bubble domain movement along the pattern of FIG. 6, in which the bias field $H_b$ is plotted against the magnitude of the drive field $H_{xy}$.
Figure 8:
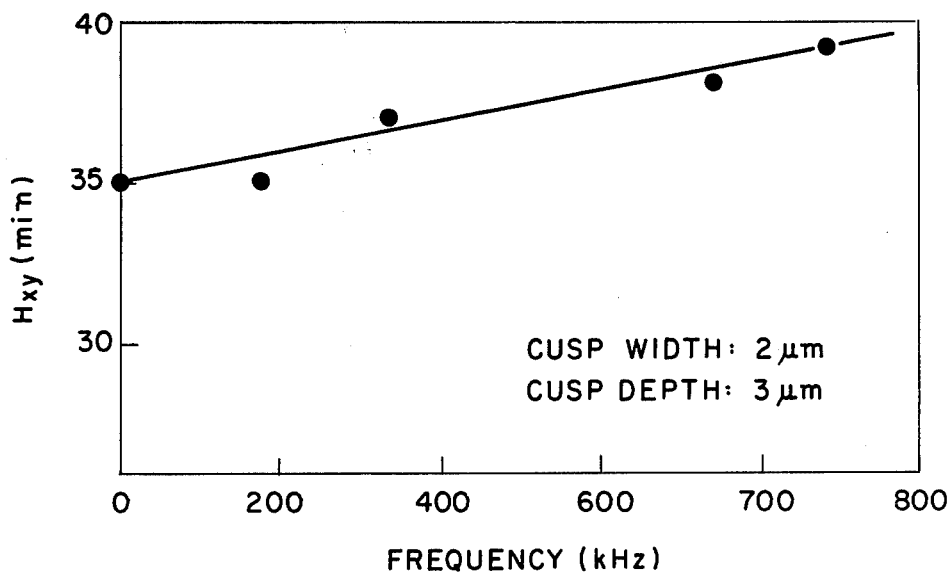
FIG. 8 is a plot of the minimum drive field required for different frequencies of rotation of the drive field for a pattern having the same cusp width and depth as the pattern used to provide the curves of FIG. 7.

High frequency measurements were carried out to determine the propagation margins. At a drive field of 40 Oe, a 15 Oe margin was found at 180 kHz for 10⁶ propagation steps, which is illustrated in FIG. 7. This figure plots the bias field $H_b$ versus the magnitude of the drive field $H_{xy}$. Low-bias failure was more pronounced at higher drive fields, however, and presumably was caused by circulation around individual disks in the bottom drive layer 12. As the drive frequency was increased, only a slow increase in minimum drive field was noted, as is apparent from FIGS. 7 and 8. In this regard, FIG. 8 plots the minimum drive field $H_{xy}$(min.) versus the frequency of the drive field $H_{xy}$ for a pattern having cusp width and depth identical to that illustrated in FIG. 7.

To aid in understanding these good high frequency results, measurements were made of the variation of the bubble velocity along a period of the propagation track. In contrast to such measurements previously made for other bubble domain propagation structures, the present results for the permalloy contiguous element double layer propagation structure showed the lowest maximum-to-mean velocity ratios observed to date. The smooth bubble motion is associated with the fact that, in contrast with T bars or asymmetric half disks, the present structures are gapless propagation structures. Further, in contrast with charged wall contiguous propagation elements which are also gapless, the magneto-crystalline anisotropy does not cause velocity variations in the permalloy contiguous element devices of the present structure.

Optimization of the device geometry and spacer thicknesses would permit a substantial widening of the propagation margins. Additionally, a widening of these margins could be obtained if the low bias failure mechanism of circulation around an individual disk were inhibited. A technique for doing this will be described with respect to FIG. 12, which shows high dosage ion implantation of a narrow strip of the bubble material in the region of the disk of the bottom drive layer 12, so that bubbles are prevented from circulating around individual disks.

COMPLETE MAGNETIC STORAGE CHIP (FIGS. 9A, 9B, AND 10A–10E)

Figure 9A:
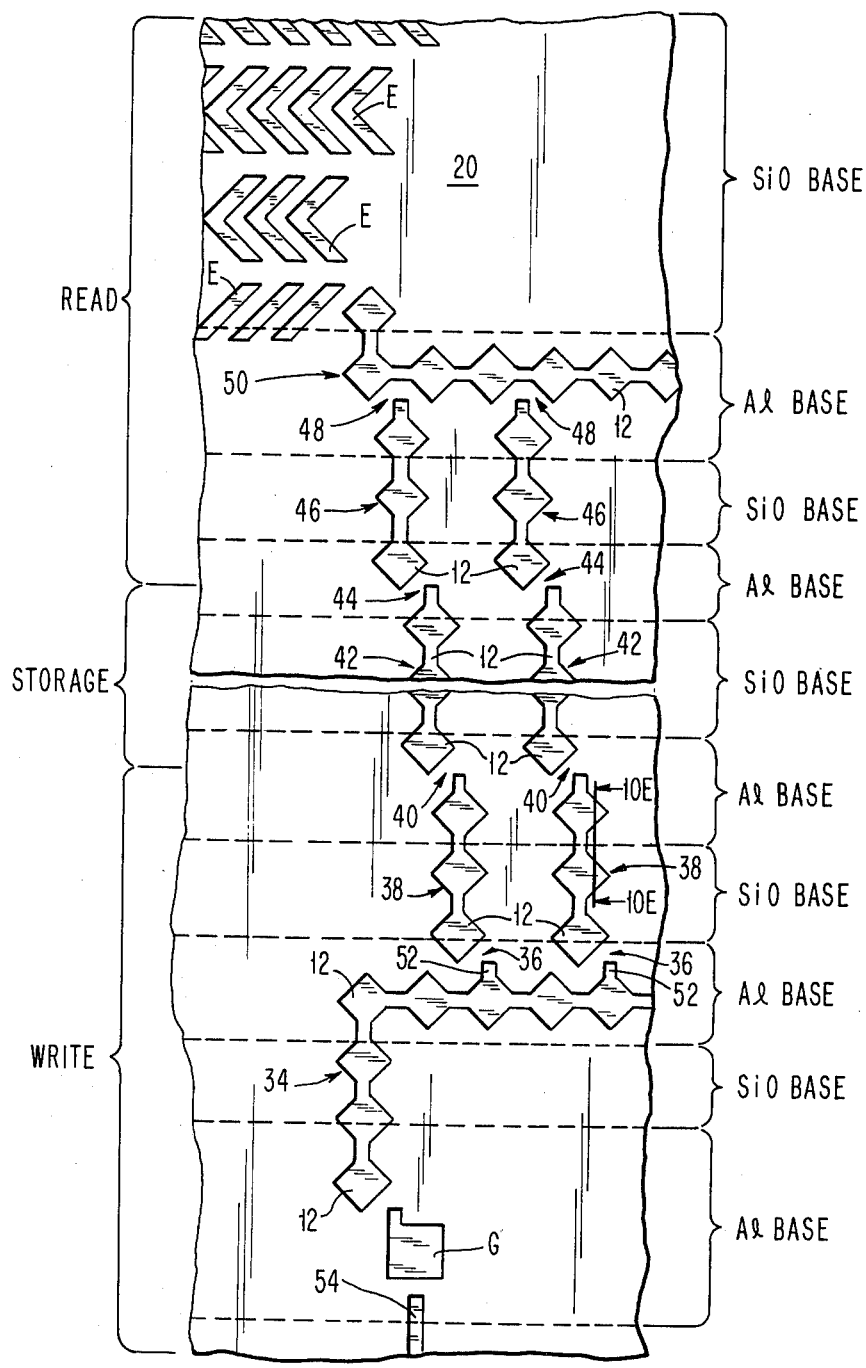

The magnetic storage chip shown in FIG. 9A is comprised of two layers of magnetically soft material, such as permalloy, which have different spacings from the underlying substrate that includes the bubble domain storage layer. Thus, a bottom drive layer 12 and a top drive layer 20 are provided, as is schematically illustrated in FIG. 9B. The spacer 30 (FIG. 9B) located under bottom drive layer 12 is comprised of an electrically insulating material, such as SiO, while the spacer 32, located under top drive layer 20, is comprised of an electrically conducting material, such as Au, Al-Cu, etc.

Before proceeding to the details of the chip layout shown in FIG. 9A, some general principles will first be described for an embodiment fabricated by single level masking techniques. If two or more levels of masking are permitted, the fabrication would be considerably easier. As usual, one of the most difficult considerations in a chip layout is the design of transfer switches for moving bubble domains from one propagation path to another. To provide successful switch operation and an overall chip layout, it is necessary to prevent current from passing through a contiguous diamond and to keep the current for one set of switches from shorting to the conducting path for another set of switches. In order to achieve these goals, spacer 30 is made from an electrically insulating material while spacer 32 is made of a conducting material in the area of the chip occupied by transfer switches. In other portions of the chip both spacers 30 and 32 are comprised of an electrically insulating material. Since the chip layout is comprised of regions occupied by switches and adjacent regions which are not occupied by transfer switches, the spacer layers can be provided by alternating bands of conducting material and non conducting material. Thus, there will be no shorting of electrical current across a contiguous diamond because an insulating layer is provided around the contiguous diamonds in the switching region of the chip. Additionally, it will be seen that the use of a conducting spacer, which is non magnetic, can be used not only to provide spacing of the top drive layer, but also for current carrying functions.

Referring more particularly now to FIG. 9A, which is a top view of the chip, the bottom drive layer 12 includes propagation paths comprised of contiguous diamond geometries, a generally rectangular bubble domain generator G, and chevron shaped expanders E. The top drive layer 20 is the inverse of the bottom drive layer 12, and comprises a continuous sheet of magnetically soft material having apertures therein identical in shape to the pattern in the bottom drive layer 12. For example, drive layer 20 has an aperture having the generally rectangular shape of generator G, apertures having the shape of the contiguous diamonds, and apertures having the shape of the chevron expanders E.

The chip layout comprises a write portion, a storage portion, and a read portion. The write portion includes the permalloy bubble domain generator G, a write major path 34, first write transfer switches 36, write transfer paths 38, and second write transfer switches 40. The first write transfer switches 36 are used to transfer bubble domains from the write major path 34 to the write transfer paths 38, while the second write transfer switches 40 are used to transfer bubble domains from paths 38 to the storage section of the chip comprising the minor loops 42.

The read section of the chip includes the chevron expanders which move bubble domains to a sensing element (not shown), first read switches 44, read transfer paths 46, second read transfer switches 48, and a read major path 50. The first read transfer switches 44 are used to move bubble domains from the minor loops 42 through the read transfer paths 46, while the second read transfer switches 48 are used to move bubble domains from the read transfer paths 46 to the read major path 50.

This structure of FIG. 9A is similar to the well known major/minor loop type of memory organization using separate major paths for writing and reading; however, it differs in that write transfer paths 38 and read transfer paths 36 are used between the minor loops 42 and the write major path 34 and read major path 50, respectively. The presence of these transfer paths 38 and 46 is designed to prevent undesirable bubble-bubble interaction effects between bubbles stored on the minor loops 42 and nearby bubbles on the major paths 34 and 50. These transfer paths 38 and 46 accomplish this goal because they are empty when such interactions would otherwise occur. Of course, this design requires a double switching process for complete transfer, a feature not required in the conventional major/minor loop type of storage organization.

All of the switches in this layout work in the same manner. Therefore, a description of only a single switch will be provided. Although it is possible that a brute-force pulling of a bubble from one disk to another disk on a different propagation path is feasible, the switches shown in this layout are based on a stop-start principle. For example, one of the first write transfer switches 36 will be described. Clockwise field rotation would bring bubbles along the write major path 34 until some of them rested on the protrusion 52 when drive field $H_{xy}$ pointed upward. The drive field rotation would be stopped at this direction, and resumed with the drive field then pointing to the right. A current passing through the restricted channel between the protrusion 52 and the bottom-most diamond of the write transfer paths 38 would determine whether or not a bubble switched from the protrusion 52 to the bottom diamond of the write transfer path 38. This electrical current travels in a conductor located under the top drive layer 20, this conductor being the spacer 32 shown in FIG. 9B. Since the conducting spacer is not present in the region of the diamonds, the current carrying path is restricted in the area of the write switches 36. Thus, its magnetic field concentration is greatest in the area of the switch 36, and for this reason good transfer margins will be obtained.

The switches indicated by the layout of FIG. 9A are schematic only, and can be varied as to the protrusion size 52 and the optimum diamond-to-protrusion spacing. Calculations indicate that a conductor width $W=D$ (bubble domain diameter) is optimum for the highest magnetic field gradient in the local bias field area of the switch. The design of FIG. 9A has this dimension. Additionally, the underlying spacer conductor is very thick and is covered with the top permalloy drive layer 20. Therefore these switches should be highly efficient.

In the design of FIG. 9A, the alternating bands of electrical insulation (SiO) and conductor (in this case, Al) are indicated as base layers. As can be seen from this figure, the Al spacer layers are provided in the regions where the various switches are located, the other regions of the chip having SiO as a spacer layer. Also, the diamonds located in the switching regions of the chip have an insulating layer around them, so that the current path provided by the Al layer is constricted when the current flows through the switch area. This prevents current from flowing through the contiguous diamonds and thereby prevents shorting of current across the diamonds.

In the read portion of the magnetic chip, a chevron expander-detector design has been shown, which is a design known in the art. It is desired to cause stripout of the bubble domains to provide enhanced output signal, but the $W=D$ minimum feature size is also desirable for lithographic purposes. As will be seen when the detailed fabrication steps are illustrated, the bubble domain material may be ion implanted in the regions beneath the bottom drive layer, in order to prevent recirculation of bubble domains around individual contiguous disks. However, if a single level masking approach is used, the regions of the sensor-detector will also be ion implanted, which will tend to cause exclusion of the bubble domain under the permalloy drive layer and may prevent bubbles from passing through the sensor if a thick sensor design is used. In order to overcome this effect, an additional crude masking step can be used to protect the sensor vicinity from ion implantation. Alternatively, an additional crude masking step could permit placement of a localized thin permalloy film, which would act as a thin film sensor.

In the write portion of this chip, a replicate disk type generator G is used as a source of bubbles, while the data pattern is controlled by application of switch current. The bar 54 of permalloy located below generator G serves merely to constrict the current path, about half of which is wasted in this particular design.

Fabrication of the chip of FIG. 9A using single masking techniques is illustrated in the cross-sectional views 10A-10E. In this process, FIG. 10E is a cross-section of the layout of FIG. 9A taken along the line 10—10. In this fabrication procedure, coarse alignment is used in establishing the demarcation lines between the conducting and non conducting bands (i.e., the Al and SiO bands). Since the effective switch current is determined by the constricted region between the protrusions (52) and the diamond to which transfer will occur, these demarcation lines can vary in position by several diamond diameters without affecting device operation.

FIGS. 10A-10E illustrate a process for producing the chip of FIG. 9A, where the regions of the bubble domain layer under the bottom drive layer 12 are ion implanted to prevent circulation of bubble domains around individual contiguous diamonds. This is a single level masking technique in which both the bottom drive layer 12 and the top drive layer 20 are produced in the same deposition step.

Figure 10A:
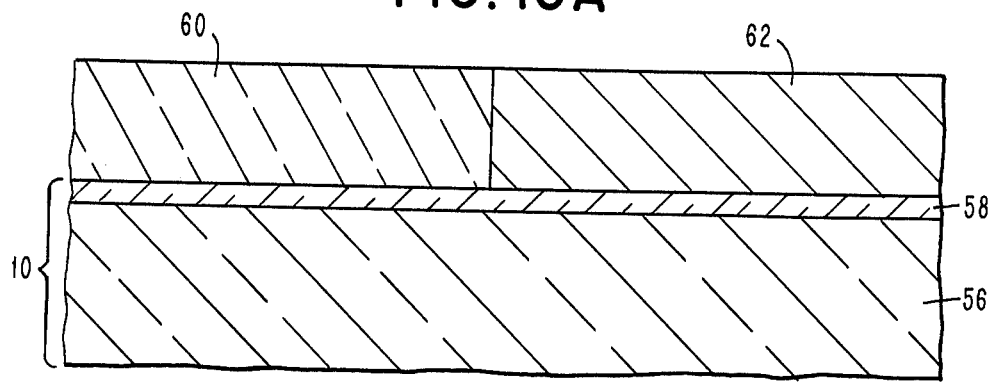
FIGS. 10A–10E are cross-sectional views of the structure of FIG. 9, which are used to illustrate a single level masking technique for producing the structure of FIG. 9.

In FIG. 10A, the same reference numerals will be used to describe the substrate 10, the bottom drive layer 12, and the top drive layer 20. Only these reference numerals will be maintained in order to relate this process to the structures and processes already described. Accordingly, the bubble domain substrate 10 includes a bubble domain layer 56, having thereon a thin SiO layer 58 (of about 300 Å) which acts as a barrier layer when the structure is later ion milled. In this manner, layer 58 will prevent milling of the top surface of the bubble domain layer 56. Contiguous bands 60 and 62 of SiO and a conductor (such as Al/Cu alloy) respectively are overlaid onto layer 58. SiO band 60 and Al/Cu band 62 have identical thicknesses and can be produced by well known processes. For example, a continuous sheet of SiO can be formed which is then etched to provide recesses for deposition of the conductive bands 62.

Bands 62 are non magnetic, electrically conductive materials which can be used to carry current for operation of the switches in the layout of FIG. 9A. While that figure indicates that the conductors are Al, the choice of the conductor material is one which is determined by factors such as electromigration. Since Al/Cu alloys are particularly good in that they are electromigration resistant, they are suitable materials, as is gold. However, gold is a difficult material on which to form insulating side walls and for this reason it is not as suitable. This factor will be more evident with respect to FIG. 10D, where the side walls of the Al/Cu bands are anodized to produce an electrical insulator.

Figure 10B:
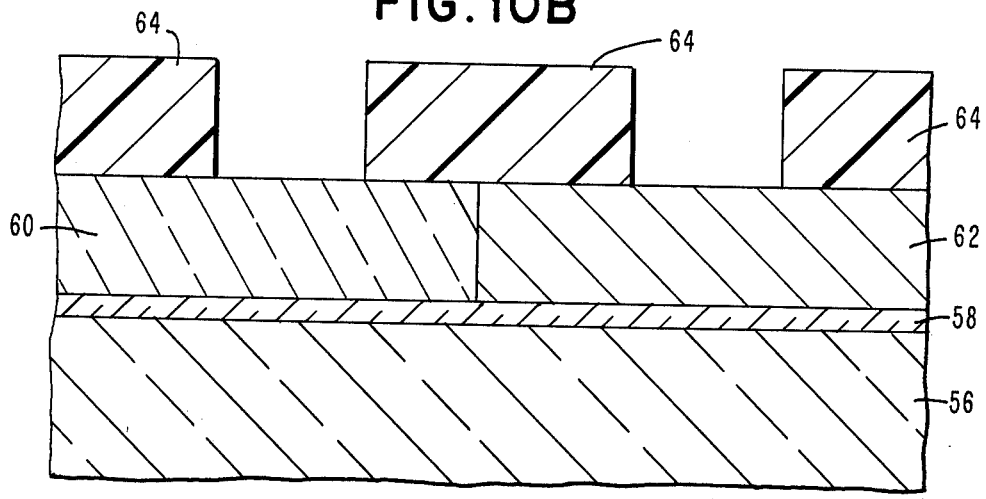

In FIG. 10B, a resist layer is applied and then exposed and developed with a mask in order to remove the resist layer in the contiguous-diamond areas corresponding to the bottom drive layer 12. This leaves the patterned resist mask 64. Resist mask 64 is used as a mask for ion milling (FIG. 10C), which is carried out so as to cut through the oxide band 60 and conductor band 62. Since both Al and SiO have about the same ion milling rates, these are suitable materials to choose. However, if it is necessary, a thin barrier can be deposited over the Al/Cu bands 62 so as to equalize the milled depths of bands 60 and 62.

Figure 10C:
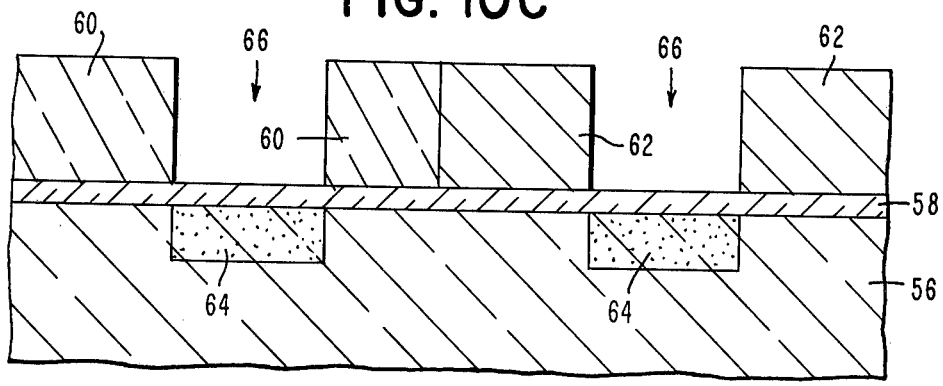

In FIG. 10C, ion implantation through the mask provided by bands 60 and 62 is carried out to a depth and dosage which will "kill" the magnetic properties of the upper part of the bubble domain film 56 in regions 64 thereof. Regions 64 are below the contiguous diamonds produced in bottom drive layer 12 and serve to prevent bubble domains from moving underneath the contiguous diamonds. In this manner, bubble domains will not recirculate around individual contiguous diamonds, but instead will pass from one contiguous diamond to the next as the drive field reorients.

Figure 10D:
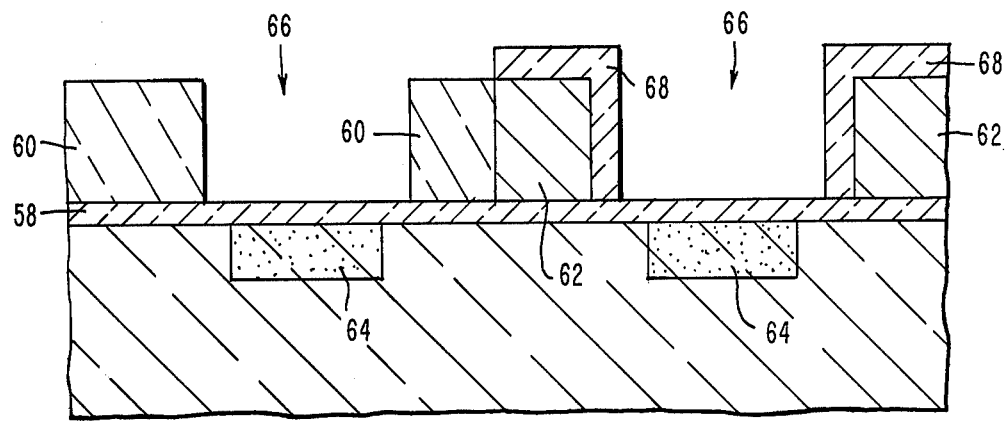
Figure 10E:
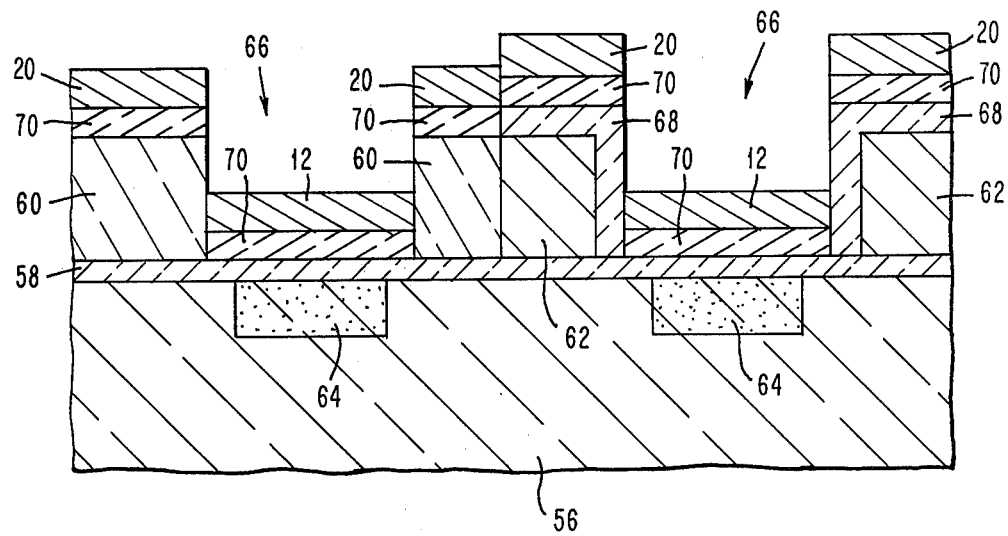

Following ion implantation, the ion milled openings 66 (FIG. 10C) are enlarged in extent by either ion milling or chemical etching, as shown in FIG. 10D. Selective etching is employed in a manner such that the SiO holes are slightly smaller than the Al/Cu holes as indicated in FIG. 10D. The Al/Cu bands 62 are then anodized so as to form insulating layers 68.

The last steps in the process are illustrated in FIG. 10E. First, an SiO spacer layer 70 is deposited over the entire structure of FIG. 10D. This spacer layer is used to provide the proper spacing between the bottom drive layer 12 and the bubble domain layer 56, and its thickness will be determined by well known magnetic considerations. Generally, spacer 70 is approximately 1,000–2,000 Å thick for 0.5 micron bubble domains. After this, a magnetically soft material is deposited to form the bottom 12 and top 20 magnetic drive layers. A suitable material for these magnetic drive layers is permalloy, although other magnetically soft materials, such as amorphous magnetic materials, could also be used.

As is evident from FIG. 10E, there is no electrical shorting between the Al-Cu conductors 62 and the permalloy of the bottom drive layer 12, due to the intervening insulating layer 68 which has been formed on the side walls of conductor bands 62 in the anodization process previously mentioned.

In the design of a complete magnetic chip such as that shown in FIG. 9A, the thicknesses of the spacer layers which separate the drive layers 12 and 20 from the bubble domain layers 56 are chosen with respect to the magnitude of the potential well which each provides for bubble domain motion. The thickness of the spacer used between the top drive layer 20 and the bubble domain layer is such that sufficient pole strength will be provided by top drive layer 20 when bubbles are in the cusp regions, but not too much pole strength when the bubbles are elsewhere. On the other hand, the difference between the thicknesses of the spacers located between the bottom and top drive layers and the bubble domain film cannot be so small that there is magnetic shorting between the top and the bottom drive layers. A spacer differential of several thousand angstroms will work well for movement of bubble domains of about 0.5 microns diameter.

ALTERNATIVE STRUCTURES (FIGS. 11 and 12)

In the practice of the present invention, the bottom drive layer 12 is comprised of contiguous propagation elements forming an undulating (serrated) edge along which bubble domains move in response to the reorientation of the magnetic drive field $H_{xy}$. It is very convenient to produce the top drive layer 20 in the same deposition step and in this fashion the top drive layer will be positioned correctly with respect to the bottom drive layer in order to provide reliable motion through the cusps formed along the undulating edge of the bottom drive layer. However, different designs can be used to form the top drive layer, as long as a potential well is provided for bubbles when they are in the cusp regions. FIG. 11 shows an alternative structure for providing the potential well in the cusp regions, although this structure is not as favorable as those previously shown.

In FIG. 11, the contiguous diamonds in the bottom drive layer 12 are the same as those shown previously, for example, in FIG. 9A. However, the top drive layer 20 is comprised of a plurality of I-bars 72, which are located over the cusp regions along the edges of the contiguous diamonds. Since the bars 72 are long with respect to the width of the neck of the contiguous diamonds in the cusp regions, they will provide stronger magnetic poles than the diamonds when the bubble domains are in the cusp regions, and will therefore provide a potential well for movement of bubbles in these regions.

If the minimum dimension of the pattern is one bubble diameter (W=D), however, there are some difficulties in moving the bubble to and from the I-bars 72 without some possible strip-out problems. For this reason, the I-bars 72 of FIG. 11 are not as suitable as the other designs for the top drive layer 20. However, the concept presented herein is the provision of a top drive layer to provide potential wells for movement of bubble domains at those times when reliable propagation by the bottom drive layer is not possible.

It has previously been mentioned that a possible failure mechanism noted in prior art permalloy contiguous disk structures has been recirculation of bubble domains around individual contiguous disks. In order to prevent this, the bubble domain layer can be ion implanted in those areas under the contiguous propagation elements of the bottom drive layer 12, as was done in the layout of FIG. 9A. However, it is not necessary, or even desirable, to ion implant the entire area under the contiguous propagation elements of the bottom drive layer.

In order to permit the overlap of the bubble and the permalloy needed for good flux linkage, the permalloy contiguous propagation elements of the bottom drive layer are made wider in extent than the area of the ion implantation. Thus, in FIG. 12, the substrate 10 has a thin strip 74 thereof which is ion implanted. The bottom drive layer 12 is formed above the substrate 10 so that the ion implanted strip 74 runs longitudinally along the pattern 12 as indicated. This will prevent bubble domains from circulating around individual contiguous diamonds of the pattern 12, and will also provide a sufficient amount of magnetically soft material for good flux linkage to the underlying bubble domain B.

In the practice of this invention, a bubble domain propagation structure is provided using two non coplanar magnetic drive layers, each of which is comprised of a magnetically soft material. The bottom drive layer provides good bubble domain propagation along a portion of the propagation path, while the top drive layer ensures good propagation when propagation due to the bottom drive layer would be unreliable. Consequently, a potential well is provided for the bubble domain during all phases of its propagation, in contrast with prior art structures wherein unreliable propagation was obtained by the use of magnetically soft patterns. The present invention provides propagation with good margins, and a structure which can be made by single masking techniques in order to achieve processing simplicities. Still further, the lithographic constraints of the present structure are such that harsh lithographic constraints are not required.

In the further practice of this invention, a complete magnetic chip can be provided having all functions required for a magnetic bubble domain storage chip. All of these functions can be provided using magnetically soft material in a design that is compatible with the principles of the present invention.

Of course, it will be apparent to those of skill in the art that other types of chip layouts, other geometries, spacer thicknesses, etc. can be used. Generally, the top layer is located with respect to the bottom layer such that the proper magnetic poles can be formed for bubble movement. However, the exact lateral position of the top layer can be adjusted for design of the proper magnetic pole configuration. Regardless of these design changes, the principles of the present invention can be extended based on the general guidelines given herein.

Having thus described my invention, what is claimed as new, and is desired to be secured by Letters Patent is:

1. A propagation structure for movement of magnetic bubble domains in a substrate including a magnetic medium in which said bubble domains can be moved, comprising:

a first magnetic drive layer comprised of a magnetically soft material which is patterned to form contiguous propagation elements for movement of bubble domains therealong in response to the reorientation of a magnetic field in the plane of said first drive layer, the edges of said contiguous propagation elements along which said bubble domains move forming a generally undulating edge having cusp regions therealong, a second magnetic drive layer comprised of a magnetically soft material and being non coplanar with said first magnetic drive layer, said second drive layer being on the same side of said substrate as said first drive layer and having a different spacing from said substrate than said first magnetic layer, said second drive layer including magnetic means for forming potential wells in said cusp regions for substantial control of bubble domain motion in said cusp regions, said bubble domain motion in regions outside of said cusp regions being substantially controlled by said first magnetic drive layer.

2. The structure of claim 1, where said second magnetic drive layer is spaced at a greater distance from said magnetic medium than said first magnetic drive layer.

3. The structure of claim 1, where said second drive layer has a pattern which is substantially the inverse of the pattern formed by said first drive layer.

4. The structure of claim 1, where said second drive layer is separated from said magnetic bubble domain layer by a spacer including a non magnetic, electrically conductive material.

5. The structure of claim 1, including means for preventing circulation of bubble domains around individual contiguous propagation elements defined in said first magnetic drive layer.

6. The structure of claim 1, where said first magnetic drive layer includes a plurality of contiguous propagation elements, and said second drive layer is comprised of a continuous sheet of magnetically soft material having apertures therein which have identical shapes to the contiguous propagation elements in said first drive layer, and are symmetrically located with respect to said contiguous propagation elements.

7. A magnetic bubble domain storage chip for storage of data represented by a magnetic bubble domains, comprising:

a substrate including a magnetic medium in which said bubble domains can be moved, alternating bands of electrically conductive material and electrically insulating material formed on said substrate, a first magnetic drive layer located over said electrically insulating bands and being patterned to form contiguous propagation elements defining a generally serrated edge along which said bubble domains move in response to the reorientation of a magnetic field in the plane of said first drive layer, said serrated edge including cusp-shaped regions therealong, a second magnetic drive layer located over said electrically conductive bands and over said cusp regions for substantially controlling bubble domain motion in said cusp regions, said second drive layer being spaced from said substrate by a different amount than said first drive layer, transfer switches for transferring bubble domains from one propagation path to another, said transfer switches including said bands of electrically conductive material through which current is passed in order to effect transfer of said bubble domains from one propagation path to another.

8. The magnetic storage chip of claim 7 where said first and second magnetic drive layers are comprised of permalloy.

9. The magnetic storage chip of claim 7, where said first magnetic drive layer includes contiguous propagation elements having insulating material therearound for narrowing said bands of electrically conductive material in the transfer regions of said transfer switches for concentrating current in said transfer regions.

10. The storage chip of claim 9, further including means for altering the magnetic properties of said magnetic bubble domain medium in selected regions under said first drive layer for preventing circulation of bubble domains around individual contiguous elements of said first magnetic drive layer.

11. The storage chip of claim 7, where said bands of electrically conductive material have an insulating layer thereon for electrically isolating said bands from said first and second drive layers.

12. A magnetic bubble domain propagation means for movement of magnetic bubble domains in a substrate including a magnetic medium in which said bubble domains can be moved, in response to the reorientation of a magnetic drive field substantially in the plane of said magnetic medium, said propagation means including:

a first magnetic drive layer comprised of a magnetically soft material patterned to provide contiguous propagation elements defining a generally serrated edge having cusp regions therealong, said bubble domains moving along said generally serrated edge in response to the reorientation of said magnetic field, magnetic means for substantially dominating magnetic bubble domain motion in said cusp regions, said magnetic means including a layer of magnetically soft material located over said cusp regions on the same side of said magnetic medium as said first magnetic drive layer and spaced farther from said bubble domain magnetic medium than said first drive layer, said magnetic means having a geometry such that magnetic poles created therealong have a greater effect on bubble domain motion when said bubble domains are in said cusp regions than the magnetic poles created along said first drive layer.

13. The structure of claim 12, wherein the geometry of said first drive layer and said magnetic means is such that, for a given orientation of magnetic drive field, said first drive layer and said magnetic means produce magnetic poles of opposite sign.

14. The structure of claim 13, where said first drive layer is comprised of a patterned magnetically soft material defining contiguous propagation elements, while said magnetic means is comprised of a layer of magnetically soft material having apertures therein which are non coplanar with said contiguous propagation elements and which are symmetrically located with respect to the corresponding contiguous propagation elements of said first magnetic drive layer.

15. The structure of claim 12, where said magnetic means is patterned to have a geometry that is the inverse of the pattern in said first magnetic drive layer, said inverse pattern in said magnetic means being aligned with respect to the pattern in said first magnetic drive layer.

* * * * *